(12) United States Patent
Seong et al.

(10) Patent No.: US 8,962,422 B2
(45) Date of Patent: Feb. 24, 2015

(54) METHOD OF FABRICATING SEMICONDUCTOR DEVICES

(71) Applicant: Samsung Electronics Co., Ltd., Suwon-si, Gyeonggi-do (KR)

(72) Inventors: Ho-Jun Seong, Hwaseong-si (KR); Jae-Hwang Sim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/804,398

(22) Filed: Mar. 14, 2013

(65) Prior Publication Data

US 2013/0337643 A1    Dec. 19, 2013

(30) Foreign Application Priority Data

Jun. 14, 2012  (KR) .................. 10-2012-0063939

(51) Int. Cl.
*H01L 27/088* (2006.01)
*H01L 29/66* (2006.01)
*H01L 21/28* (2006.01)
*H01L 29/788* (2006.01)
*H01L 27/115* (2006.01)
*H01L 49/02* (2006.01)
*H01L 27/06* (2006.01)

(52) U.S. Cl.
CPC .... *H01L 29/66477* (2013.01); *H01L 29/66825* (2013.01); *H01L 21/28273* (2013.01); *H01L 29/7881* (2013.01); *H01L 27/11521* (2013.01); *H01L 28/20* (2013.01); *H01L 27/0629* (2013.01)
USPC ....... 438/238; 438/210; 438/382; 257/E21.35

(58) Field of Classification Search
CPC ............................ H01L 28/20; H01L 27/0629
USPC ......... 438/200, 201, 210, 211, 238, 264, 383, 438/593–594; 257/E21.35
See application file for complete search history.

(56) References Cited

U.S. PATENT DOCUMENTS

| 7,238,584 | B2 | 7/2007 | Chun | |
|---|---|---|---|---|
| 2003/0119243 | A1* | 6/2003 | Shin et al. | ..................... 438/200 |
| 2008/0188054 | A1 | 8/2008 | Kim et al. | |

FOREIGN PATENT DOCUMENTS

| KR | 10-2001-0096353 A | 11/2001 |
|---|---|---|
| KR | 10-2006-0016276 A | 2/2006 |
| KR | 10-0797304 B1 | 1/2008 |

* cited by examiner

*Primary Examiner* — Thanhha Pham
(74) *Attorney, Agent, or Firm* — Lee & Morse, P.C.

(57) ABSTRACT

A method of fabricating a semiconductor device includes etching a substrate to form a field trench defining an active region and a lower gate pattern on the active region, the lower gate pattern including a tunneling insulating pattern and a lower gate electrode pattern, filling a field insulating material in the field trench to form a field region, forming an upper gate pattern on the lower gate pattern, sequentially forming a stopping layer and a buffer layer on the field region and the upper gate pattern, forming a first resistive pattern on the buffer layer of the field region, and forming a second resistive pattern on the buffer layer on the upper gate pattern, forming an interlayer insulating layer covering the first and second resistive patterns, and performing a planarization process to remove a top surface of the interlayer insulating layer and to remove the second resistive pattern.

20 Claims, 14 Drawing Sheets

METHOD OF FABRICATING SEMICONDUCTOR DEVICES

CROSS-REFERENCE TO RELATED APPLICATION

The present application claims priority under 35 U.S.C. §119 to Korean Patent Application No. 10-2012-0063939, filed on Jun. 14, 2012, in the Korean Intellectual Property Office, and entitled: "Method of Fabricating Semiconductor Devices," which is incorporated by reference herein in its entirety.

BACKGROUND

1. Field

Embodiments relate to a semiconductor device having a resistive pattern and a method of fabricating the same.

2. Description of Related Art

Semiconductor devices may include electronic circuits variously disposed on a substrate. The electronic circuits may include a MOS transistor and resistive interconnections.

SUMMARY

Embodiments are directed to a method of fabricating a semiconductor device including etching a substrate to form a field trench defining an active region and a lower gate pattern on the active region, the lower gate pattern including a tunneling insulating pattern and a lower gate electrode pattern, filling a field insulating material in the field trench to form a field region, forming an upper gate pattern on the lower gate pattern, sequentially forming a stopping layer and a buffer layer on the field region and the upper gate pattern, forming a first resistive pattern on the buffer layer of the field region, and forming a second resistive pattern on the buffer layer on the upper gate pattern, forming an interlayer insulating layer covering the first and second resistive patterns, and performing a planarization process to remove a top surface of the interlayer insulating layer and to remove the second resistive pattern.

The upper gate pattern may include a barrier pattern, a metal pattern, and a gate capping pattern, which are sequentially stacked.

The gate capping pattern may include a lower gate capping pattern including silicon nitride, and an upper gate capping pattern including silicon oxide.

The method may further include forming an intermediate gate pattern between the lower gate pattern and the upper gate pattern, wherein the intermediate gate pattern has a greater horizontal width than that of the lower gate pattern, and has a lateral surface aligned with the upper gate pattern.

The intermediate gate pattern may include an inter-gate insulating pattern formed on the lower gate pattern and an intermediate gate electrode pattern that is formed on the inter-gate insulating pattern and that penetrates the inter-gate insulating pattern to be in contact with the lower gate electrode. The intermediate gate electrode pattern may include polysilicon having p-type impurities.

The intermediate gate electrode pattern may include a first intermediate gate electrode pattern vertically overlapping the inter-gate insulating pattern, and a second intermediate gate electrode pattern that is formed on the first intermediate gate electrode pattern and that penetrates the first intermediate gate electrode pattern to be in contact with the lower gate electrode.

The intermediate gate pattern may partially extend to and horizontally overlap a portion of the lateral surface of the lower gate pattern. The field insulating material may be interposed between a portion of the intermediate gate pattern and a portion of the lower gate pattern, which horizontally overlap.

The buffer layer may include silicon oxide, and the stopping layer may include silicon nitride.

The performing of the planarization process may include removing the buffer layer formed on the upper gate pattern to expose the stopping layer on the upper gate pattern.

The performing of the planarization process may further include removing the exposed stopping layer to expose the top surface of the upper gate pattern.

The method may further include forming a gate spacer on a lateral surface of the upper gate pattern before forming the stopping layer. The stopping layer may be formed on an external lateral surface of the gate spacer.

The forming of the field region may include filling the field trench and forming the field insulating material covering the lower gate pattern, performing a planarization process to planarize top surfaces of the field insulating material and the lower gate pattern, and recessing the top surface of the field insulating material such that the top surface of the field insulating material is aligned with a lateral surface of the lower gate electrode pattern.

The lower gate electrode pattern may include polysilicon having a p-type impurity. The first resistive pattern and the second resistive pattern include polysilicon having an n-type impurity.

The method may further include conformally forming a gate liner including silicon oxide on a top surface and a lateral surface of the upper gate pattern before forming the stopping layer.

Embodiments are also directed to a method of fabricating a semiconductor device including forming a tunneling insulating layer and a lower gate electrode layer on a substrate, etching the lower gate electrode layer, the tunneling insulating layer and the substrate to form a field trench defining structures including active regions and lower gate patterns on the active regions, the field trench being disposed between the structures including active regions and the lower gate patterns, filling a field insulating material in the field trench to form a field region, forming upper gate patterns on the lower gate patterns, forming gate spacers on lateral surfaces of the upper gate patterns, the gate spacers being in contact with the field insulating material, forming a stopping layer, a buffer layer and a resistive layer covering top surfaces of the upper gate patterns and the gate spacers, the stopping layer, the buffer layer and the resistive layer extending onto the field region, forming first resistive patterns on the field region, and forming second resistive patterns on the upper gate patterns by patterning the resistive layer, forming an interlayer insulating layer covering the first and second resistive patterns, and performing a planarization process to remove a top surface of the interlayer insulating layer, and to remove the second resistive pattern and a portion of the buffer layer on the upper gate patterns.

Embodiments are also directed to a method of fabricating a semiconductor device including forming dummy elements on a substrate, and forming resistive patterns between the dummy elements, the dummy patterns being gate patterns formed on active regions and including p-type polysilicon and the resistive patterns being formed on a field region between the active regions and including n-type polysilicon.

The active regions and the field region may be formed by forming a tunneling insulating layer and a lower gate electrode layer on a substrate, etching the lower gate electrode layer, tunneling insulating layer, and substrate to form a field trench defining the active regions, the active regions having lower gate patterns thereon, and the field trench being between the active regions, and filling the field trench with a field insulating material to form the field region.

Forming the dummy elements and resistive patterns may further include forming intermediate gate patterns and upper gate patterns on the lower gate patterns, forming gate spacers on lateral surfaces of the intermediate gate patterns and upper gate patterns, forming a stopping layer, a buffer layer and a resistive layer covering top surfaces of the upper gate patterns and the gate spacers, the stopping layer, buffer layer and the resistive layer extending into the field region to cover the field insulating material, and patterning the resistive layer to form the resistive patterns on the field region and sacrificial resistive patterns on the upper gate patterns, forming an interlayer insulating layer covering the resistive patterns on the field region and the sacrificial resistive patterns on the upper gate patterns, and performing a planarization process to remove a top surface of the interlayer insulating layer, and to remove the sacrificial resistive patterns and the buffer layer from the upper gate patterns.

The planarization process may further remove the stopping layer from the upper gate patterns.

The method may further include conformally forming a gate liner including silicon oxide on a top surface and lateral surface of the upper gate pattern before forming the stopping layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
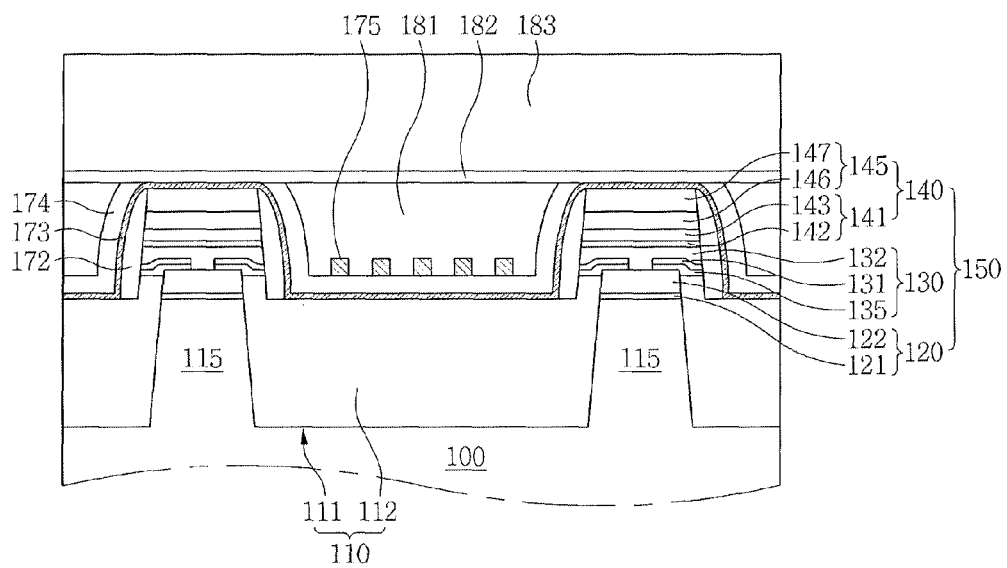
FIGS. 1A to 1D illustrate schematic cross-sectional views of semiconductor devices according to embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented and the spatially relative descriptors used herein interpreted accordingly.

Also, embodiments may be described with reference to schematic plan views or cross-sectional views, which are schematic diagrams of idealized example embodiments of the inventive disclosure. As such, variations from the shapes of the illustrations, as a result, for example, of manufacturing techniques and/or tolerances, are to be expected. For example, an etched region illustrated in a right angle may be in the rounded shape or in the shape of having a predetermined curvature. Thus, embodiments should not be construed as being limited to the particular shapes of regions illustrated herein, but are to include deviations in shapes that result from, e.g., a manufacturing process. Thus, the regions illustrated in the drawings are schematic in nature and are not intended to limit the scope.

Like reference numerals designate like elements throughout the specification. Therefore, even though identical or similar reference numerals are not described in the corresponding drawing, they may be described with reference to the other drawings. Also, even though no reference numeral is indicated, such elements may be described with reference to the other drawings.

FIGS. 1A to 1D illustrate schematic cross-sectional views of semiconductor devices 10A to 10D according to embodiments.

Referring to FIG. 1A, a semiconductor device 10A according to an embodiment may include gate patterns 150 disposed on a substrate 100, a field region 110 disposed between the gate patterns 150, and a plurality of resistive patterns 175 disposed on the field region 110. The field region 110 may define an active region 115.

The gate patterns 150 may include a lower gate pattern 120, an intermediate gate pattern 130 and an upper gate pattern 140.

The lower gate pattern 120 may include a tunneling insulating pattern 121 formed on the active region 115 of the substrate 100 and a lower gate electrode pattern 122 formed on the tunneling insulating pattern 121. The tunneling insulating pattern 121 may include an oxide. For example, the tunneling insulating pattern 121 may include silicon oxide or a metal oxide. The lower gate electrode pattern 122 may include polysilicon having a p-type impurity such as boron (B). A lateral surface of the lower gate pattern 120 may be aligned with a lateral surface of the active region 115. The lateral surface of the active region 115 may be tapered toward the lateral surface of the lower gate pattern 120.

The intermediate gate pattern 130 may include an inter-gate insulating pattern 135, a first intermediate gate electrode pattern 131, and a second intermediate gate electrode pattern 132.

The inter-gate insulating pattern 135 may be formed as a single layer or as multiple layers. For example, the inter-gate insulating pattern 135 may include a single layer of silicon oxide or silicon nitride or multiple layers of silicon oxide, silicon nitride, and/or silicon oxide.

The first intermediate gate electrode pattern 131 may vertically overlap the inter-gate insulating pattern 135 to be aligned therewith. For example, in a top view, the first intermediate gate electrode pattern 131 may be in a same shape as the inter-gate insulating pattern 135.

The second intermediate gate electrode pattern 132 may vertically penetrate the first intermediate gate electrode pattern 131 and the inter-gate insulating pattern 135 to be in contact with the lower gate electrode pattern 122. The first intermediate gate electrode pattern 131 and the second intermediate gate electrode pattern 132 may include polysilicon having a p-type impurity such as B. For example, when the first intermediate gate electrode pattern 131 and the second intermediate gate electrode pattern 132 include the same material, a boundary therebetween may not exist. That is, the first intermediate gate electrode pattern 131 and the second intermediate gate electrode pattern 132 may be integrally formed or materially continuous with each other.

The inter-gate insulating pattern 135 may cover a portion of the lateral surface of the lower gate electrode pattern 122. The inter-gate insulating pattern 135 may have a conformal profile. Accordingly, the first intermediate gate electrode pattern 131 may cover a portion of the lateral surface of the lower gate electrode pattern 122 as well. For example, the first intermediate gate electrode pattern 131 may horizontally overlap a portion of the lateral surface of the lower gate electrode pattern 122 with the inter-gate insulating pattern 135 interposed therebetween. The second intermediate gate electrode pattern 132 may penetrate the first intermediate gate electrode pattern 131 and the inter-gate insulating pattern 135 to be in contact with the lower gate electrode pattern 122.

The upper gate pattern 140 may include a barrier pattern 142, a metal pattern 143 and a gate capping pattern 145. The barrier pattern 142 may include tungsten nitride (WN), titanium (Ti), titanium nitride (TiN), tantalum (Ta), tantalum nitride (TaN), titanium tungsten (TiW) or other suitable material for a barrier. The metal pattern 143 may include a metal such as tungsten (W) or copper (Cu). The gate capping pattern 145 may include a lower gate capping pattern 146 and an upper gate capping pattern 147. The lower gate capping pattern 146 may include silicon nitride, and the upper gate capping pattern 147 may be formed of silicon oxide.

A lateral surface of the intermediate gate pattern 130 may be aligned with a lateral surface of the upper gate pattern 140. The lateral surface of the intermediate gate pattern 130 may be tapered toward the lateral surface of the upper gate pattern 140.

A gate spacer 172 may be formed to surround the lateral surface of the intermediate gate pattern 130 and the lateral surface of the upper gate pattern 140. The gate spacer 172 may have a horizontal width that is upwardly narrowed. A lower end of the gate spacer 172 may be in contact with a field insulating material 112. The gate spacer 172 may horizontally overlap the lower gate electrode pattern 122 with the field insulating material 112 interposed therebetween. For example, the field insulating material 112 may be interposed between the lower gate pattern 120 and the gate spacer 172. The gate spacer 172 may include silicon oxide.

A stopping layer 173 may be conformally formed on a top surface of the gate patterns 150 and the gate spacer 172. The stopping layer 173 may extend onto the field region 110. For example, the stopping layer 173 may be conformally formed on the field insulating material 112. The stopping layer 173 may horizontally overlap the lower gate electrode pattern 122 with the field insulating material 112 and the gate spacer 172 interposed therebetween. In addition, the stopping layer 173 may horizontally overlap the tunneling insulating pattern 121 with the field insulating material 112 interposed therebetween. The stopping layer 173 may include silicon nitride.

A buffer layer 174 may be formed on the stopping layer 173. The buffer layer 174 may extend onto the field region 110. For example, the buffer layer 174 may be formed on the stopping layer 173 formed on the field insulating material 112. The buffer layer 174 may not cover a portion of the stopping layer 173 formed on the gate pattern 150. For example, the portion of the stopping layer 173 formed on the gate pattern 150 may be exposed without being covered with the buffer layer 174.

The plurality of resistive patterns 175 may be formed on the field region 110 between the gate patterns 150. For example, the resistive patterns 175 may be formed on the buffer layer 174. The resistive patterns 175 may include polysilicon having an n-type impurity such as phosphorous (P) or arsenic (As).

A lower interlayer insulating layer 181 may be formed on the buffer layer 174 to cover the plurality of resistive patterns 175. A topmost surface of the buffer layer 174 and a top surface of the lower interlayer insulating layer 181 may be co-planar. For example, the top surface of the buffer layer 174 may be disposed at substantially the same level as that of the lower interlayer insulating layer 181. In addition, a top surface of the stopping layer 173 may be disposed at substantially the same level as that of the lower interlayer insulating layer 181. The lower interlayer insulating layer 181 may fill the space between the gate patterns 150. The lower interlayer insulating layer 181 may include silicon oxide.

An intermediate interlayer insulating layer 182 may be formed on the lower interlayer insulating layer 181. The intermediate interlayer insulating layer 182 may extend in a horizontal direction. The intermediate interlayer insulating layer 182 may include a more solid material than the lower interlayer insulating layer 181, e.g., silicon nitride. The intermediate interlayer insulating layer 182 may not be omitted.

An upper interlayer insulating layer 183 may be formed on the intermediate interlayer insulating layer 182. The upper interlayer insulating layer 183 may include silicon oxide.

Figure 1B:
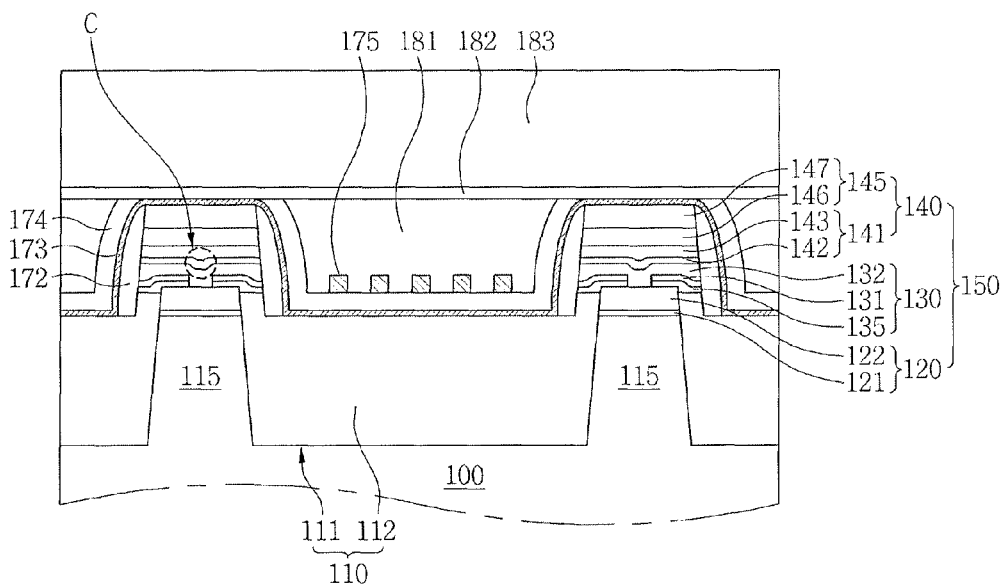

Referring to FIG. 1B, a semiconductor device 10B according to an embodiment may include gate patterns 150 disposed on a substrate 100, a field region 110 disposed between the gate patterns 150, and a plurality of resistive patterns 175 disposed on the field region 110. Each of the gate patterns 150 may include an upper gate pattern 140, an intermediate gate pattern 130 and a lower gate pattern 120. The intermediate gate pattern 130 may include an inter-gate insulating pattern 135, a first intermediate gate electrode pattern 131 and a second intermediate gate electrode pattern 132 formed on the lower gate pattern 120. A top surface of the second intermediate gate electrode pattern 132 may include a concave portion C. The concave portion C may be aligned with a portion where the second intermediate gate electrode pattern 132 vertically penetrates the first intermediate gate electrode pattern 131 and the inter-gate insulating pattern 135 to be in contact with the lower gate electrode pattern 122. The concave portion C may be in the shape of a groove, furrow, or dent. A barrier pattern 142 of an upper gate electrode pattern 141 of the upper gate pattern 140 may have a shape according to the concave portion C. For example, the barrier pattern 142 may have a depressed portion corresponding to the concave portion C. In other aspects, the semiconductor device 10B illustrated in FIG. 1B may be the same as the semiconductor device 10A illustrated in FIG. 1A.

Figure 1C:
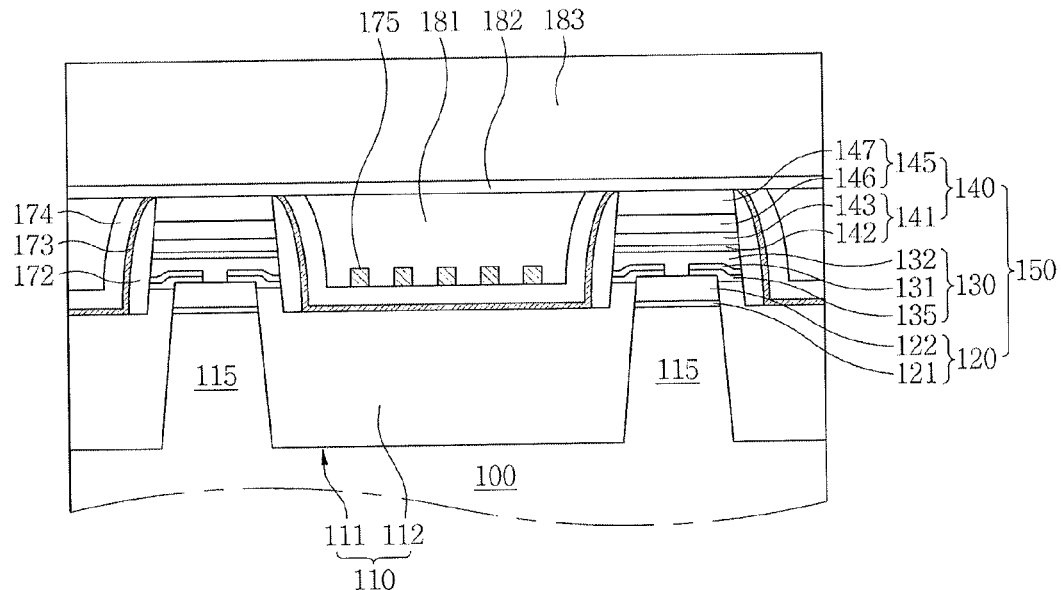

Referring to FIG. 1C, a semiconductor device 10C according to an embodiment may include gate patterns 150 disposed on a substrate 100, a field region 110 disposed between the gate patterns 150, and a plurality of resistive patterns 175 disposed on the field region 110. A stopping layer 173 and a buffer layer 174 may not cover a top surface of the gate pattern 150. A top surface of an upper gate capping pattern 147 of the gate pattern 150 may be in contact with an intermediate interlayer insulating layer 182 or upper interlayer insulating layer 183. Top surfaces of a lower interlayer insulating layer 181, the buffer layer 174, and the stopping layer 173 and the upper gate capping pattern 147 may be disposed at the same level to be co-planar. In other aspects, the semiconductor device 10C illustrated in FIG. 1C may be the same as the semiconductor device 10A illustrated in FIG. 1A.

Figure 1D:
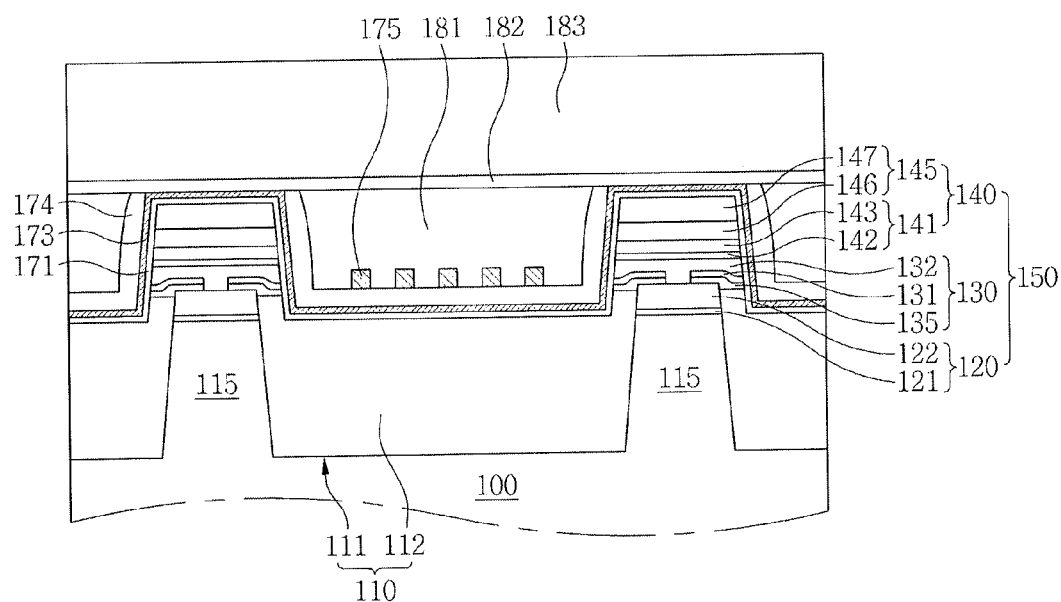

Referring to FIG. 1D, a semiconductor device 10D according to an embodiment may include gate patterns 150 disposed on a substrate 100, a field region 110 disposed between the gate patterns 150, and a plurality of resistive patterns 175 disposed on the field region 110. The semiconductor device 10D may further include a gate liner 171 conformally covering outer surfaces of the gate patterns 150. The gate liner 171 may extend onto a field insulating material 112. The gate liner 171 may horizontally overlap a lower gate electrode pattern 122 with the field insulating material 112 interposed therebetween. For example, the field insulating material 112 may be interposed between the gate liner 171 and a lower gate pattern 120. In other aspects, the semiconductor device 10D illustrated in FIG. 1D may be the same as the semiconductor device 10A illustrated in FIG. 1A.

In the semiconductor devices 10A to 10D according to embodiments, the gate patterns 150 may be dummy elements. The semiconductor devices 10A to 10D may have a layout in which the resistive patterns 175 are surrounded by the dummy elements. The resistive patterns 175 may form circuital elements.

The circuital elements surrounded by the dummy elements may be protected from electrical, physical and/or chemical influences. For example, a coupling phenomenon between the circuital elements and adjacent real elements may be reduced or prevented, and the circuital elements may be protected from external attack caused by a manufacturing process or by an impact.

Each of the semiconductor devices 10A to 10D may include the lower gate electrode pattern 122 having a p-type impurity, the first intermediate gate electrode pattern 131 and the second intermediate gate electrode pattern 132. The lower gate electrode pattern 122, the first intermediate gate electrode pattern 131 and the second intermediate gate electrode pattern 132 may form an integrally formed floating gate electrode. When the semiconductor devices 10A to 10D are formed as a flash memory, data retention performance may be enhanced.

Each of the semiconductor devices 10A to 10D may include the resistive patterns 175 having n-type impurities. Polysilicon having an n-type impurity may facilitate an adjustment of resistance better than a polysilicon having a p-type impurity.

Figure 2A:
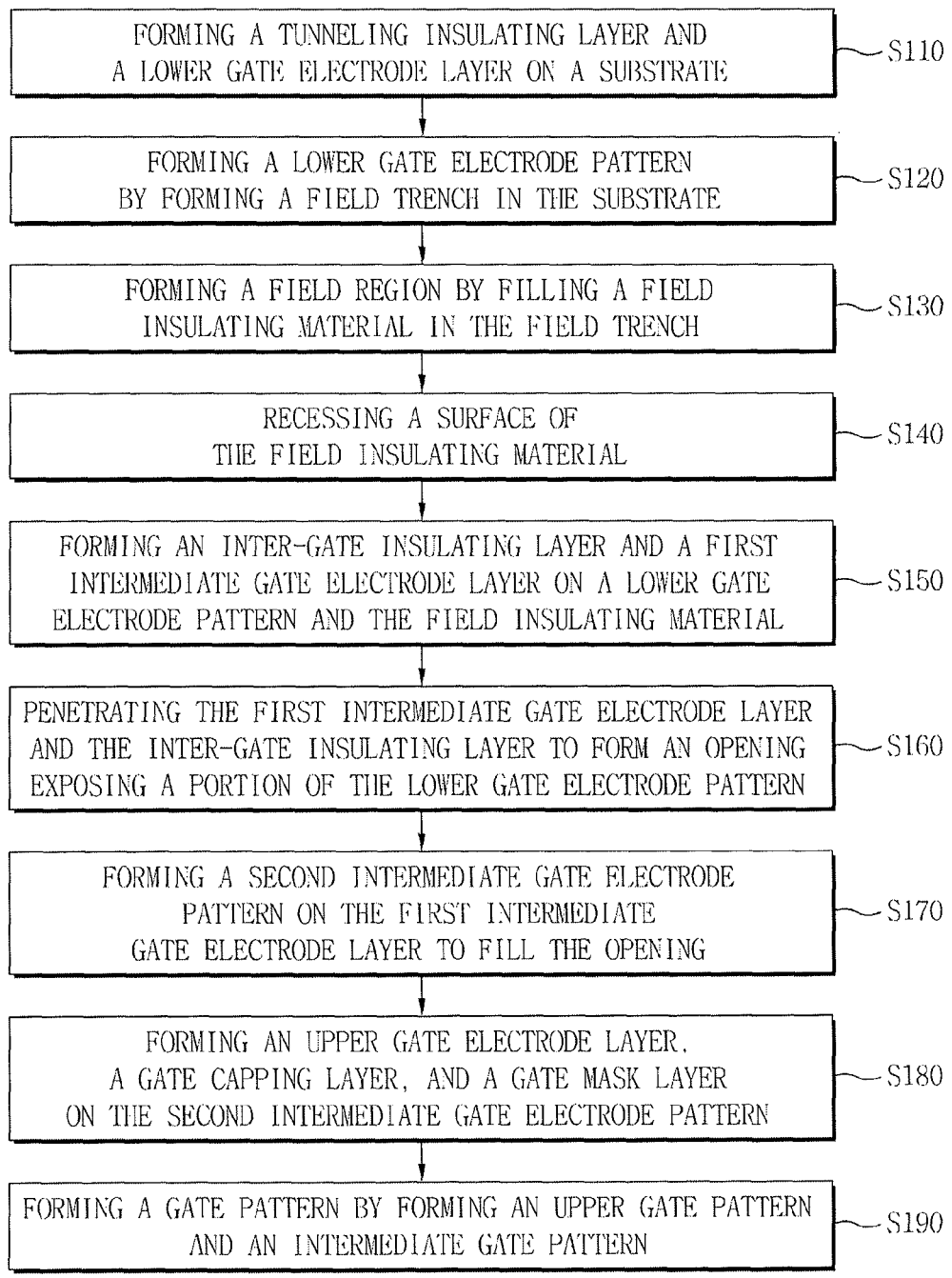
FIGS. 2A and 2B illustrate flowcharts describing a method of forming semiconductor devices according to embodiments.
Figure 2B:
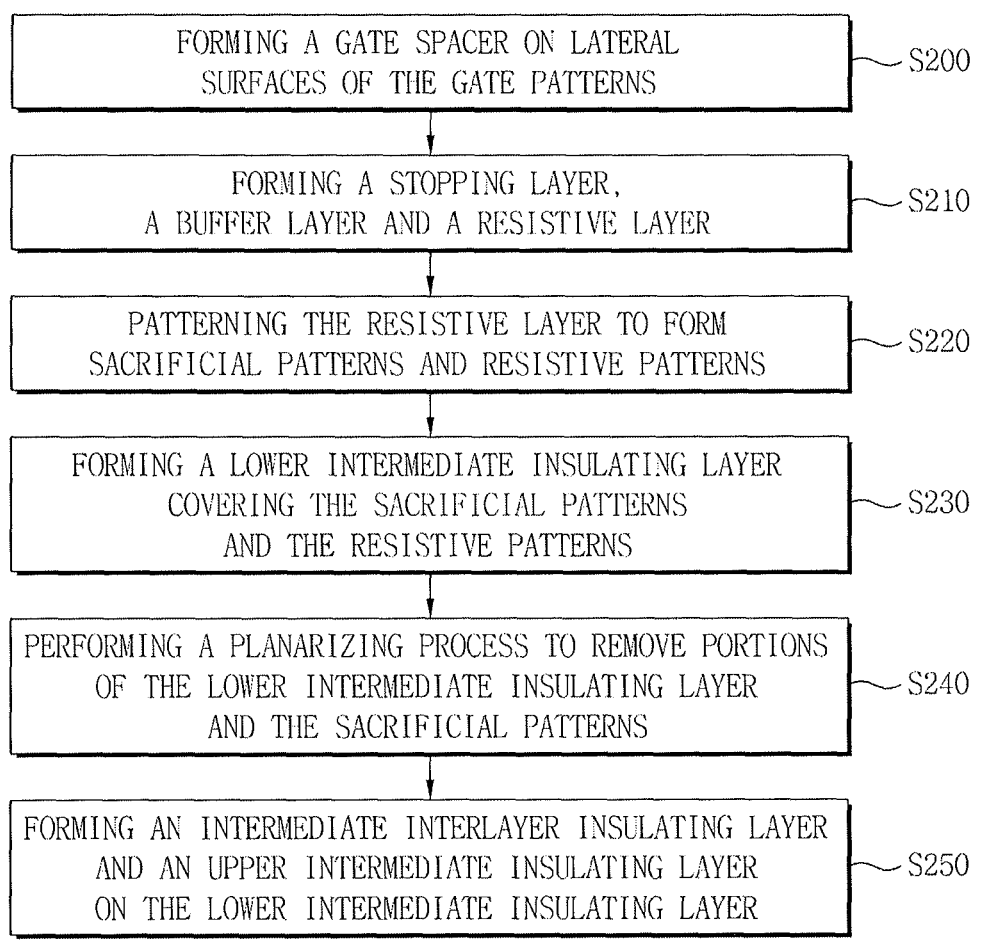
Figure 3A:
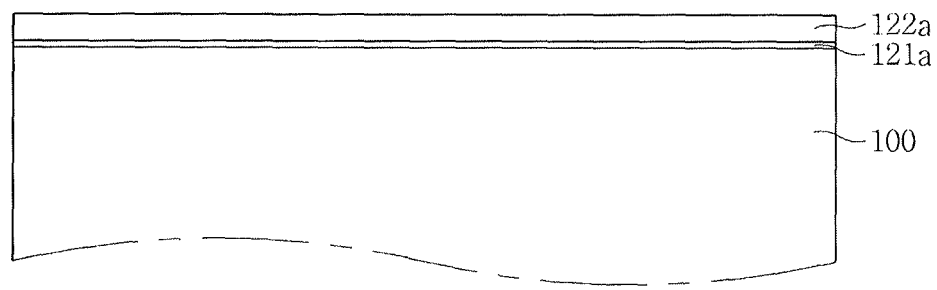
FIGS. 3A to 3N illustrate cross-sectional views depicting stages of a method of fabricating semiconductor devices according to an embodiment.

FIGS. 2A and 2B illustrate flowcharts describing a method of forming semiconductor devices 10A to 10D according to embodiments. FIGS. 3A to 3N illustrate cross-sectional views depicting stages of the method of fabricating semiconductor devices 10A to 10D according to an embodiment.

Referring to FIGS. 2A and 3A, the method of fabricating a semiconductor device 10A according to an embodiment may include forming a tunneling insulating layer 121a and a lower gate electrode layer 122a on a substrate 100 (S110). The formation of the tunneling insulating layer 121a may include performing a thermal or plasma oxidation process on a surface of the substrate 100. The formation of the lower gate electrode layer 122a may include depositing polysilicon containing a p-type dopant such as boron (B) on the tunneling insulating layer 121a using a CVD process or the like.

Figure 3B:
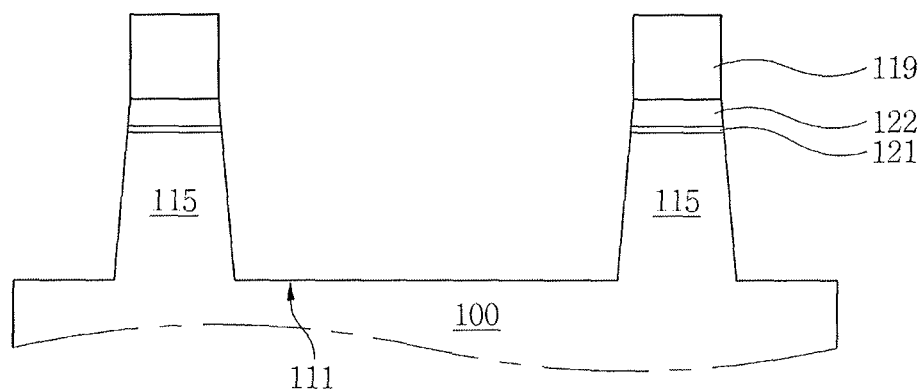

Referring to FIGS. 2A and 3B, the method of fabricating the semiconductor device 10A according to an embodiment may include forming a field trench 111 in the substrate 100 (S120). The formation of the field trench 111 may include forming a field mask pattern 119 on the lower gate electrode layer 122a, and etching the lower gate electrode layer 122a, the tunneling insulating layer 121a and the substrate 100 to form a lower gate pattern 120 including a tunneling insulating pattern 121 and a lower gate electrode pattern 122. The field mask pattern 119 may be formed as a single layer or as multiple layers including at least one of a silicon oxide layer, a silicon nitride layer, a carbon-containing silicon oxide layer, and a polymer organic material. An active region 115 may be defined in a lower portion of the tunneling insulating pattern 121 by the field trench 111. Afterwards, the field mask pattern 119 may be removed.

Figure 3C:
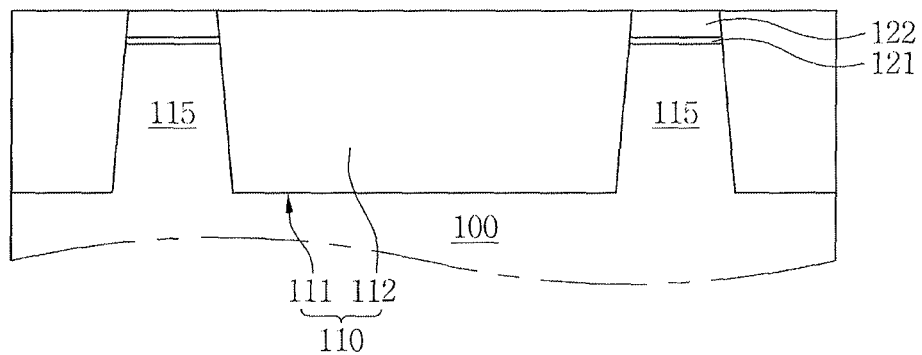

Referring to FIGS. 2A and 3C, the method of fabricating the semiconductor device 10A according to an embodiment may include forming a field region 110 (S130). The formation of the field region 110 may include forming a field insulating material 112 filling the field trench 111 and performing a planarization process such as chemical mechanical polishing (CMP). The field insulating material 112 may include silicon oxide such as undoped silicate glass (USG), and/or silazane. During this process, a top surface of the lower gate electrode pattern 122 may be exposed. A surface of the field insulating material 112 may be at substantially the same level as the surface of the lower gate electrode pattern 122. In addition, an annealing process for densification of the field insulating material 112 may be further performed prior to the CMP process.

Figure 3D:
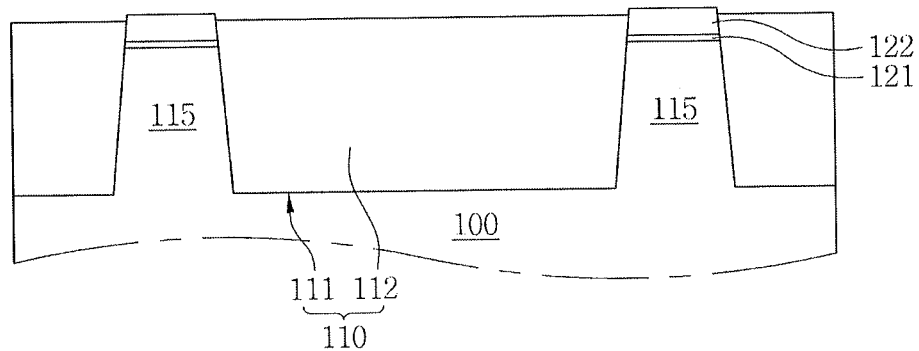

Referring to FIGS. 2A and 3D, the method of forming the semiconductor device 10A according to an embodiment may include recessing a surface of the field insulating material 112 (S140). For example, the process may include disposing the surface level of the field insulating material 112 to align with a middle portion of the lateral surface of the lower gate electrode pattern 122. During this process, the top surface and lateral surface of the lower gate electrode pattern 122 may be partially exposed. The field insulating material 112 may cover a lateral surface of the tunneling insulating pattern 121.

Figure 3E:
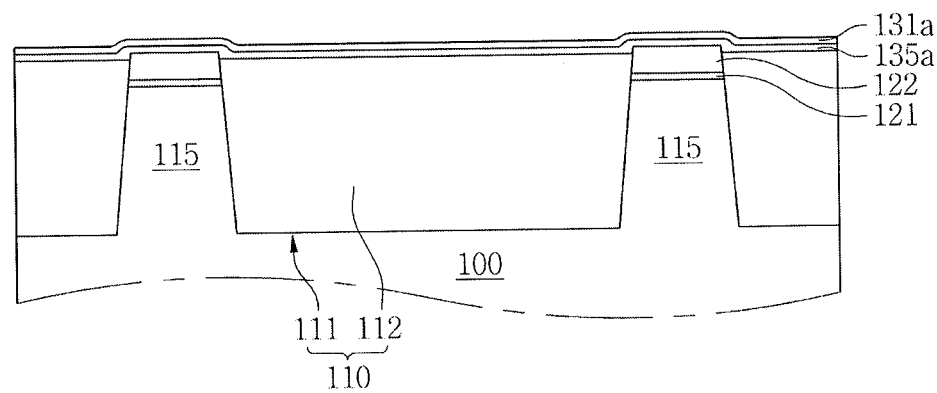

Referring to FIGS. 2A and 3E, the method of forming the semiconductor device 10A according to an embodiment may include forming an inter-gate insulating layer 135a and a first intermediate gate electrode layer 131a on the lower gate electrode pattern 122 and the field insulating material 112 (S150). The inter-gate insulating layer 135a may be formed as a multiple layer. For example, the inter-gate insulating layer 135a may include a triple layer in which silicon oxide, silicon nitride, and silicon oxide are sequentially stacked. The formation of the first intermediate gate electrode layer 131a may include forming polysilicon including a p-type dopant such as boron using a CVD process or the like.

Figure 3F:
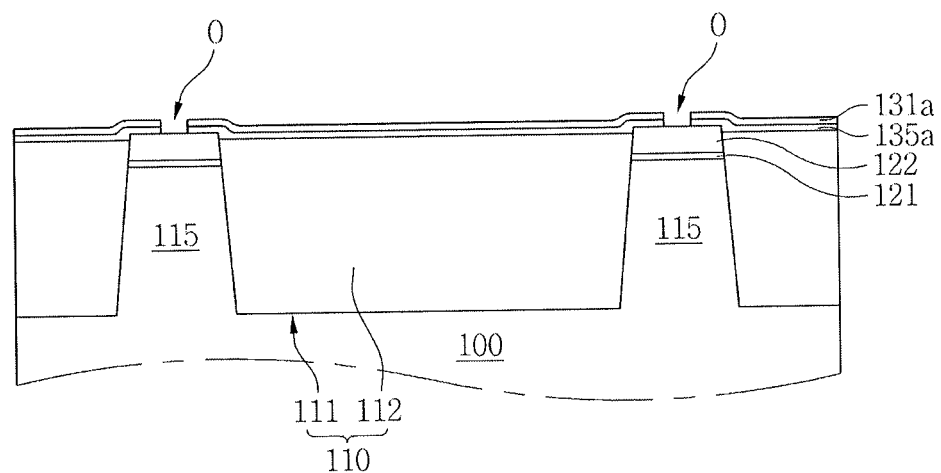

Referring to FIGS. 2A and 3F, the method of forming the semiconductor device 10A according to an embodiment may include penetrating the first intermediate gate electrode layer 131a and the inter-gate insulating layer 135a to form an opening O exposing a portion of the lower gate electrode pattern 122 (S160). The opening O may be in the shape of a groove, slit or hole.

Figure 3G:
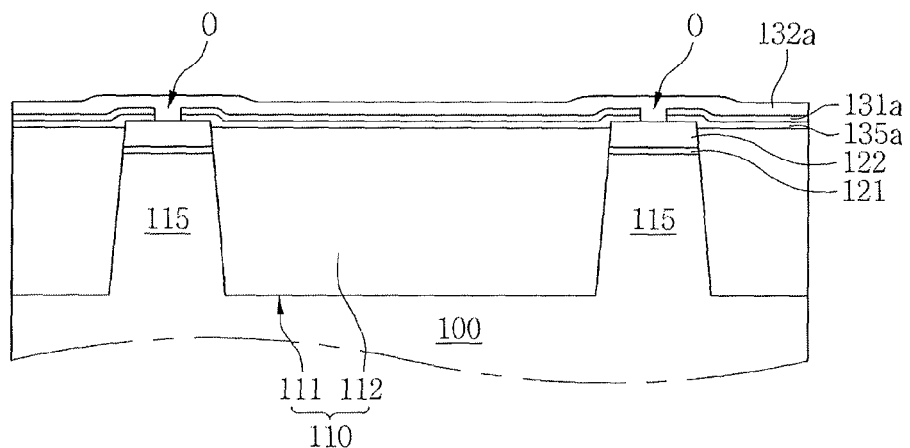

Referring to FIGS. 2A and 3G, the method of forming the semiconductor device 10A according to an embodiment may include forming a second intermediate gate electrode pattern 132a on the first intermediate gate electrode layer and filling the opening O (S170). The second intermediate gate electrode pattern 132a may be formed of polysilicon including a p-type dopant such as boron. When the first intermediate gate electrode layer 131a and the second intermediate gate electrode pattern 132a are formed of the same material, a boundary between the elements may disappear. For clarity, a boundary between the layers is illustrated.

Figure 3H:
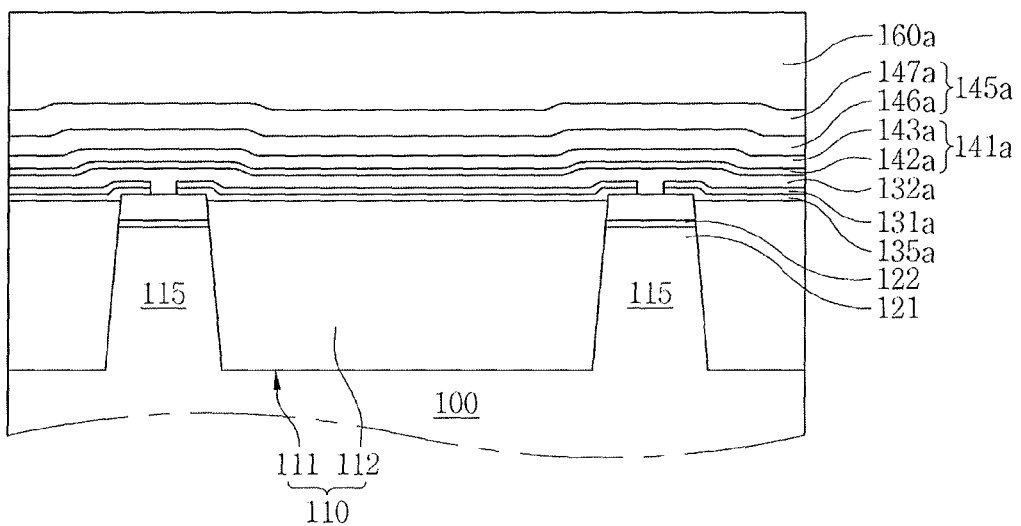

Referring to FIGS. 2A and 3H, the method of forming the semiconductor device 10A according to an embodiment may include forming an upper gate electrode layer 141a, a gate capping layer 145a, and a gate mask layer 160a on the second intermediate gate electrode layer 131a (S180). The upper gate electrode layer 141a may be formed as a multiple layer. For example, the upper gate electrode layer 141a may include a barrier layer 142a and a metal layer 143a. The barrier layer 142a may include tungsten nitride, titanium, titanium nitride, tantalum, tantalum nitride, titanium tungsten or other suitable material for a barrier. The metal layer 143a may include a metal such as tungsten, aluminum, nickel, copper, etc. The gate capping layer 145a may include a lower gate capping layer 146a and an upper gate capping layer 147a. The formation of the lower gate capping layer 146a may include forming silicon nitride using a CVD process or the like. The formation of the upper gate capping layer 147a may include forming silicon nitride using a CVD process or the like. The gate mask layer 160a may be formed as a single or as a multiple layer containing silicon oxide, silicon nitride or an organic polymer. The gate mask layer 160a is illustrated as a single layer for clarity.

Figure 3I:
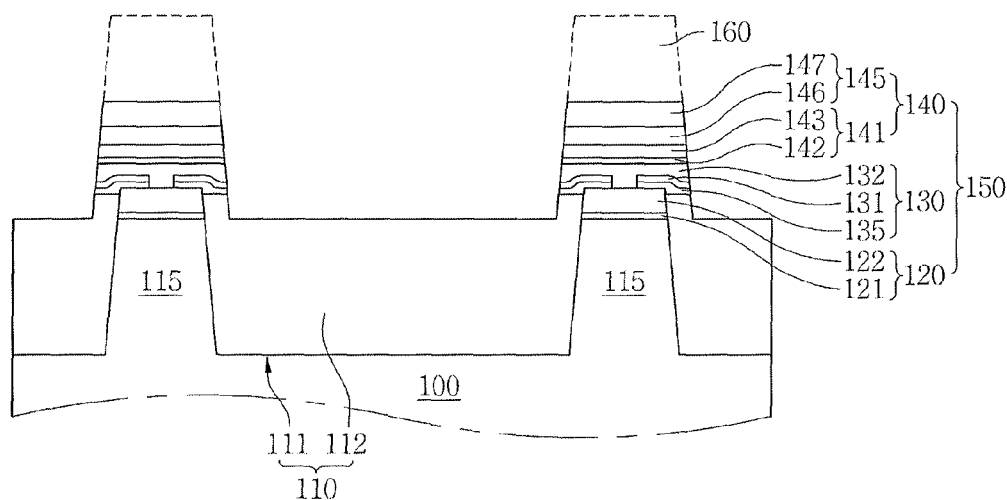

Referring to FIGS. 2A and 3I, the method of fabricating a semiconductor device 10A according to an embodiment may include forming a gate pattern 150 by forming an upper gate pattern 140 and an intermediate gate pattern 130 (S190). This process may include forming a gate mask pattern 160 by patterning the gate mask layer 160a, patterning gate capping layer 145a and the upper gate electrode layer 141a using the gate mask pattern 160 as an etch mask to form the upper gate pattern 140 having a gate capping pattern 145 and an upper gate electrode pattern 141, and patterning the second intermediate gate electrode layer 132a, the first intermediate gate electrode pattern 131a and the inter-gate insulating layer 135a to form the intermediate gate pattern 130 having the inter-gate insulating pattern 135, the first intermediate gate electrode pattern 131 and the second intermediate gate electrode pattern 132. The gate capping pattern 145 may include a lower gate capping pattern 146 and an upper gate capping pattern 147, and the upper gate electrode pattern 141 may include a barrier pattern 142 and a metal pattern 143.

During this process, the gate pattern 150 including lower gate pattern 120, the intermediate gate pattern 130, and the upper gate pattern 140 may be formed. During this process, a surface of the field insulating material 112 may be exposed or recessed. The gate patterns 150 may be dummy elements. That is, the gate patterns 150 may be elements that do not need circuital operation or connection.

The intermediate gate pattern 130 may have a greater horizontal width than the lower gate pattern 120. For example, the first intermediate gate electrode pattern 131 may cover a portion of a lateral surface of the lower gate electrode pattern 122. The upper gate pattern 140 may have a horizontal width that is the same as or smaller than that of the intermediate gate pattern 130. When lateral surfaces of the gate pattern 150 are formed in a perpendicular shape, the horizontal width of the upper gate pattern 140 may be the same as that of the intermediate gate pattern 130. When the lateral surfaces of the gate pattern 150 are formed in a tapered shape, the upper gate pattern 140 may have a smaller horizontal width than the intermediate gate pattern 130.

The gate mask pattern 160 may be removed during or after the process. Therefore, the gate mask pattern 160 is represented in FIG. 3I by a dotted line.

Figure 3J:
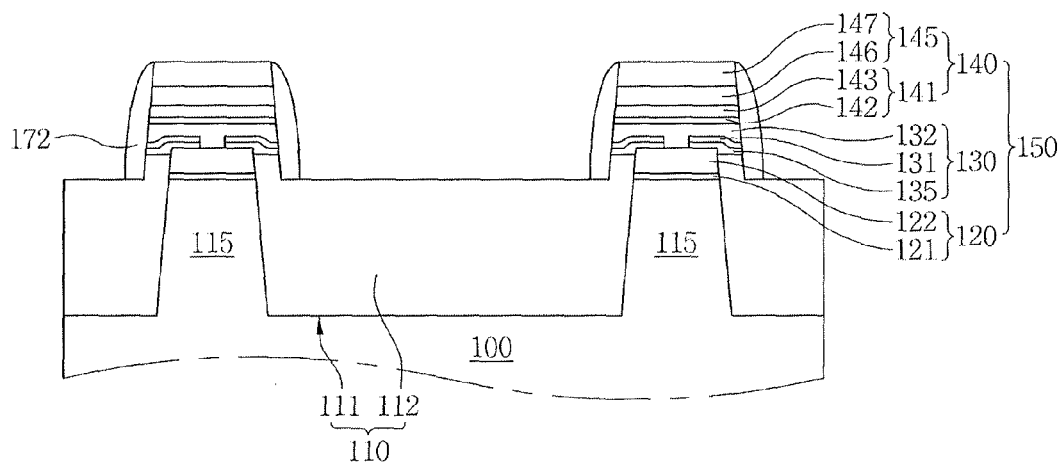

Referring to FIGS. 2B and 3J, the method of fabricating a semiconductor device 10A according to an embodiment may include forming a gate spacer 172 on a lateral surface of the gate pattern 150 (S200). The gate spacer 172 may include silicon oxide. A portion of the gate spacer 172 may extend onto a surface of the field insulating material 112. For example, the portion of the gate spacer 172 may provide a planar surface on the surface of the lower gate electrode pattern 122. For clarity, it is illustrated that the gate spacer 172 is formed only on the lateral surface of the gate pattern 150.

Figure 3K:
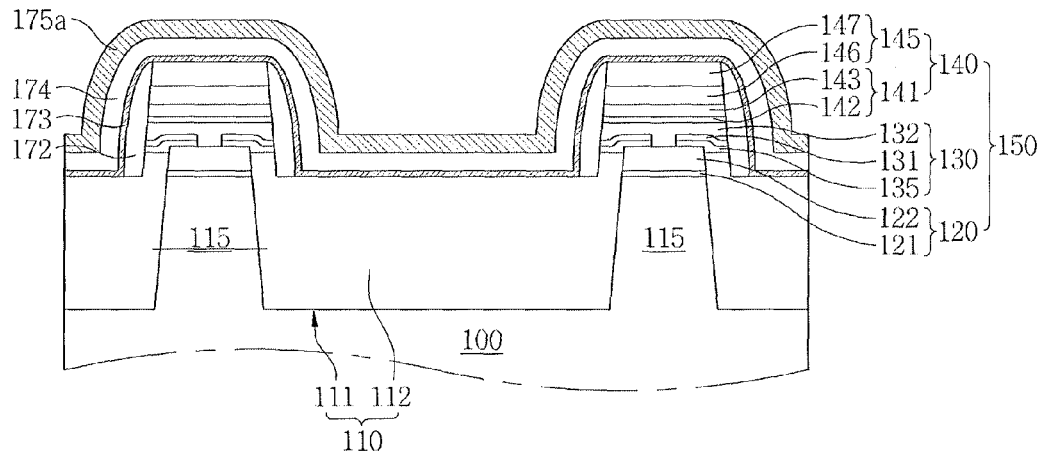

Referring to FIGS. 2B and 3K, the method of fabricating a semiconductor device 10A according to an embodiment may include conformally forming a stopping layer 173 covering the field insulating material 112, the gate spacer and the gate mask pattern 160, and forming a buffer layer 174 and a resistive layer 175a on the stopping layer 173 (S210). The formation of the stopping layer 173 may include conformally forming a denser material than the buffer layer 174, e.g., silicon nitride, using a CVD process or the like. The formation of the buffer layer 174 may include forming silicon oxide using a CVD process or the like. The formation of the resistive layer 175a may include forming polysilicon containing an n-type impurity using a CVD process or the like.

Figure 3L:
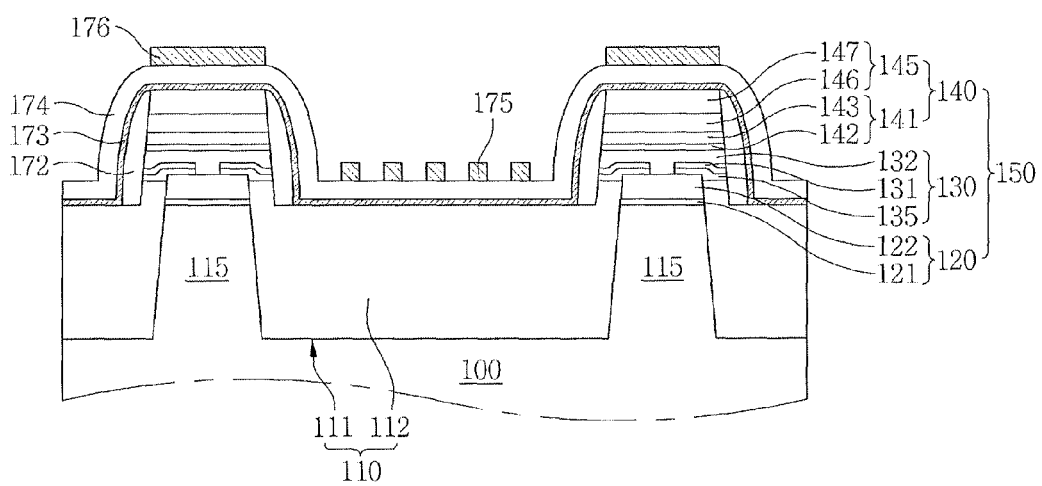

Referring to FIGS. 2B and 3L, the method of fabricating a semiconductor device 10A according to an embodiment may include patterning the resistive layer 175a to form sacrificial patterns 176 and resistive patterns 175 (S220). The sacrificial patterns 176 may be formed on the gate patterns 150, and the resistive patterns 175 may be formed on the field insulating material 112. The sacrificial patterns 176 may be disposed around the resistive patterns 175. For example, the sacrificial patterns 176 may be disposed to surround both lateral surfaces or peripheries of the resistive patterns 175 constituting a group. The sacrificial patterns 176 may be disposed at a different height from the resistive patterns 175. For example, the sacrificial patterns 176 may be disposed at a relatively high position, and the resistive patterns 175 may be disposed at a relatively low position.

The sacrificial patterns 176 formed on the gate pattern 150 may be formed at various positions with various sizes and shapes to adjust the pattern density of the resistive patterns 175 for each region. The sacrificial patterns 176 may be formed at the same time as the resistive patterns 175. Accordingly, the sacrificial patterns 176 may have a thickness that is substantially the same as or similar to that of the resistive patterns 175.

Figure 3M:
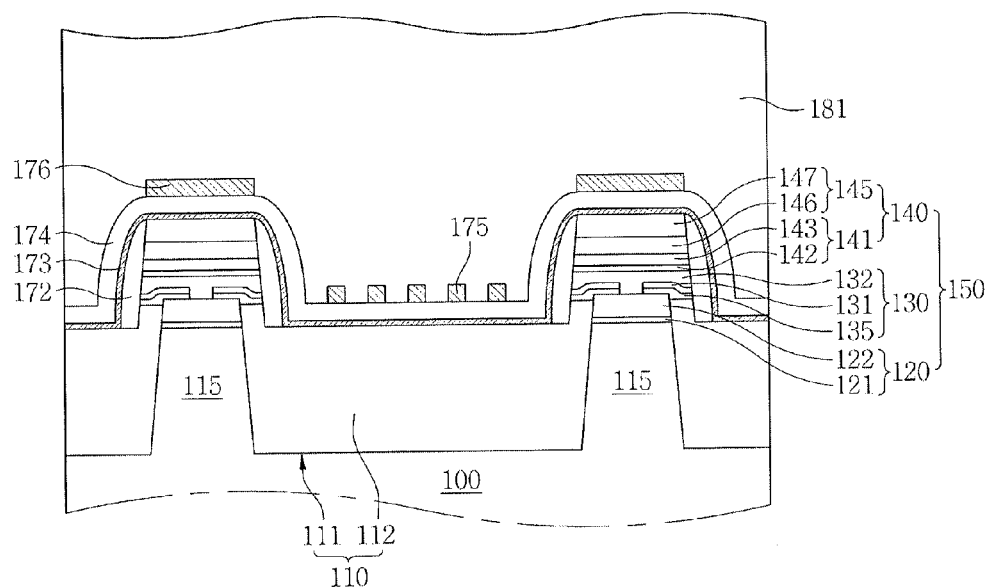
Figure 3N:
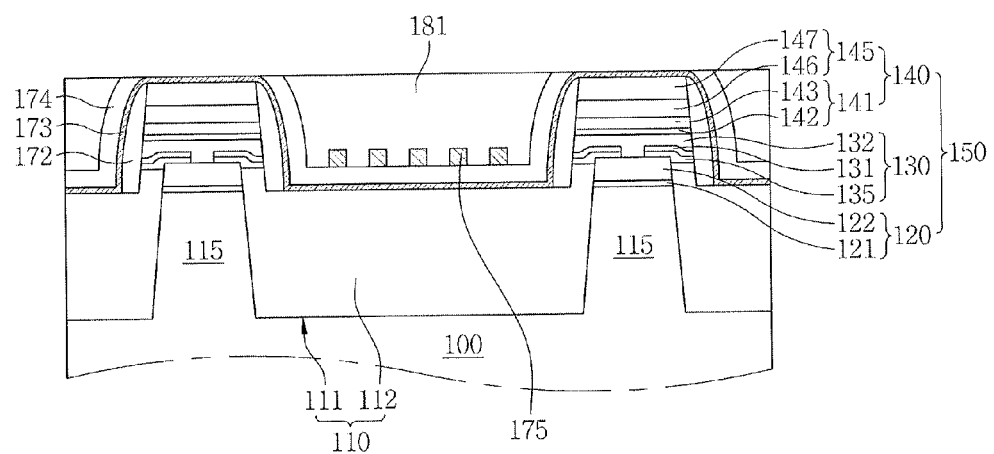

Referring to FIGS. 2B and 3M, the method of fabricating a semiconductor device 10A according to an embodiment may include forming a lower intermediate insulating layer 181 covering the sacrificial patterns 176 and the resistive patterns 175 (S230). The lower intermediate insulating layer 181 may be formed of silicon oxide. The resistive patterns 175 may be surrounded by the gate patterns 150. Therefore, the resistive patterns 175 may be protected from external physical or chemical attack of processing factors.

Referring to FIGS. 2B and 3N, the method of fabricating a semiconductor device 10A according to an embodiment may include performing a planarization process such as a CMP process, so that a portion of the lower intermediate insulating layer 181 and the sacrificial patterns 176 are removed (S240). During this process, the buffer layer 174 covering a top surface of the gate pattern 150 may be removed, so that the stopping layer 173 is exposed.

Afterwards, referring back to FIGS. 2B and 1A, the method of fabricating a semiconductor device 10A according to an embodiment may include forming an intermediate interlayer insulating layer 182 and an upper intermediate insulating layer 183 on the planarized lower intermediate insulating layer 181 (S250). The formation of the intermediate interlayer insulating layer 182 may include forming silicon nitride using a CVD process. The formation of the upper intermediate insulating layer 183 may include forming silicon oxide using a CVD process or the like.

Figure 4:
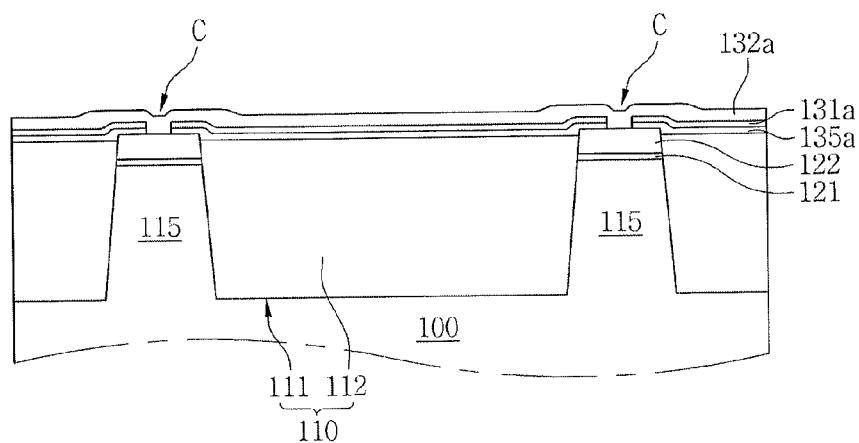
FIGS. 4, 5, 6A, and 6B illustrate cross-sectional views depicting stages of methods of fabricating a semiconductor device according to various embodiments.

FIG. 4 illustrates a cross-sectional view illustrating a stage of a method of fabricating a semiconductor device 10B according to an embodiment.

Referring to FIG. 4, the method of fabricating a semiconductor device 10B according to an embodiment may include performing the processes described with reference to FIGS. 3A to 3F, and then forming a second intermediate gate electrode layer 132a to fill an opening O, wherein a concave portion C according to a profile of the opening O is formed on a portion where the second intermediate gate electrode layer 132a is aligned with the opening O. The concave portion C may be formed in the shape of a groove, a furrow or a dent.

The method may include performing the processes described with reference to FIGS. 3H to 3N, and forming an intermediate interlayer insulating layer 182 and an upper intermediate insulating layer 183 on the planarized lower interlayer insulating layer 181 with further reference to FIG. 1B.

Figure 5:
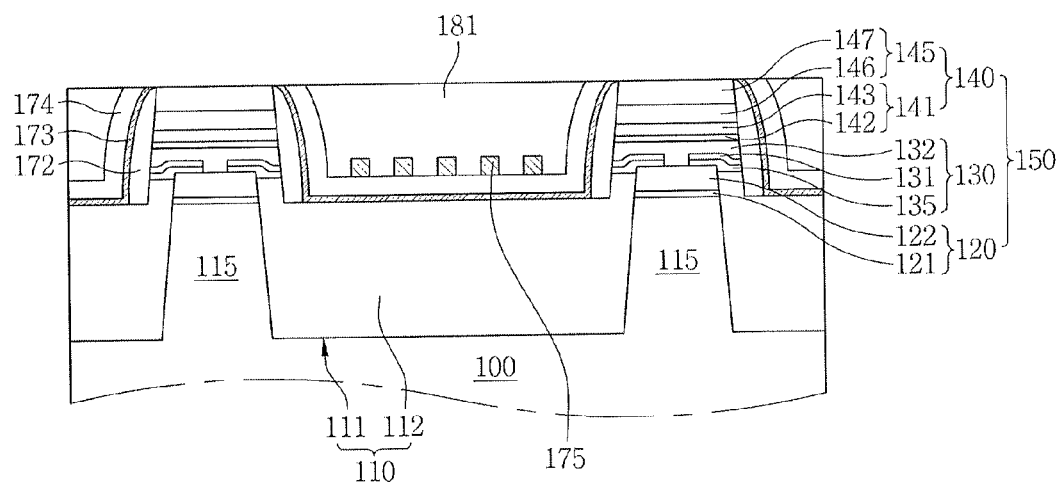

FIG. 5 illustrates a cross-sectional view illustrating a stage of a method of fabricating a semiconductor device 10C according to an embodiment.

Referring to FIG. 5, the method of fabricating a semiconductor device 10C according to an embodiment may include performing the processes described with reference to FIGS. 3A to 3M, and then removing the stopping layer 173 formed on the gate pattern 150 to expose the upper gate capping pattern 146 when a portion of the lower interlayer insulating layer 181 and the sacrificial pattern 176 are removed.

Afterwards, referring back to FIG. 1C, the method of fabricating a semiconductor device 10C according to an embodiment may include forming the intermediate interlayer insulating layer 182 and the upper intermediate insulating layer 183 on the planarized lower interlayer insulating layer 181 and exposed upper gate capping pattern 146.

Figure 6A:
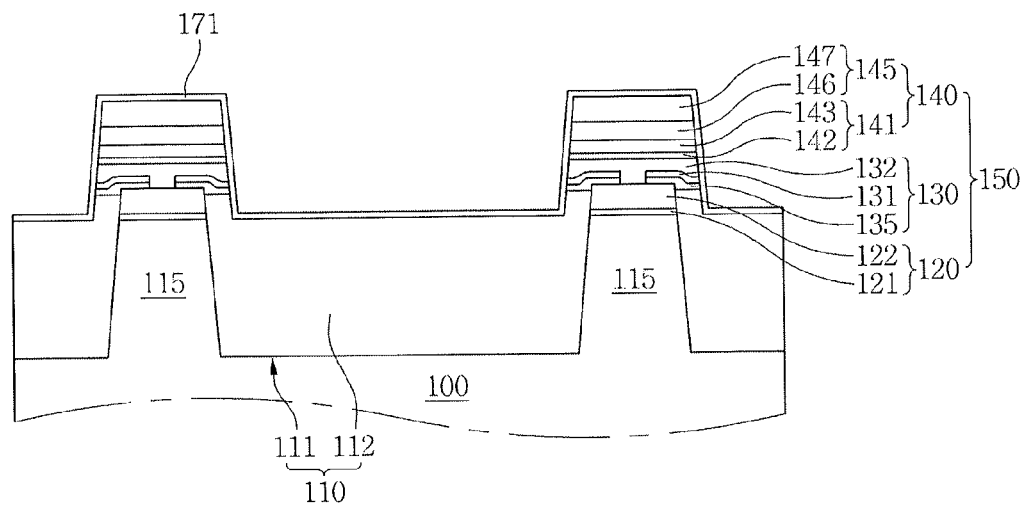
Figure 6B:
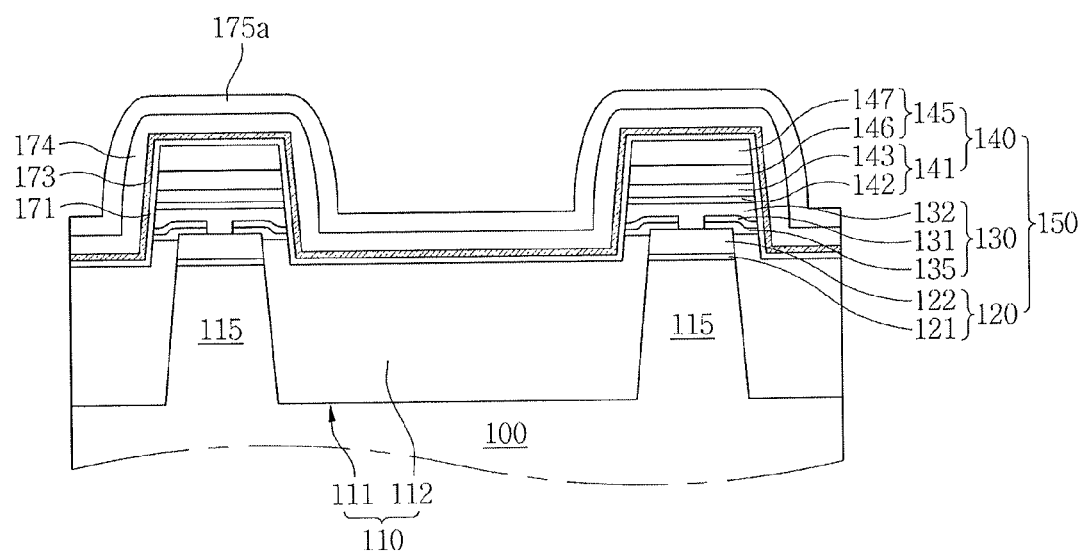

FIGS. 6A and 6B illustrate cross-sectional views illustrating stages of a method of fabricating a semiconductor device 10D according to an embodiment.

Referring to FIG. 6A, the method of fabricating a semiconductor device 10D according to an embodiment may include performing the processes described with reference to FIGS. 3A to 3I, and then conformally forming a gate liner 171 on a lateral surface of the gate pattern 150. The gate liner 171 may be formed of silicon oxide. A portion of the gate liner 171 may be formed by extending onto a surface of a field insulating material 112. Therefore, the portion of the gate liner 171 may provide a planarized surface on the surface of the field insulating material 112.

Referring back to FIG. 6B, the method of fabricating a semiconductor device 10D according to an embodiment may include conformally forming a stopping layer 173 covering the gate liner 171 with further reference to FIG. 3K, and forming a buffer layer 174 and a resistive layer 175a on the stopping layer 173. This method may include performing the processes described with reference to FIGS. 3L to 3N, and then conformally forming an intermediate interlayer insulating layer 182 and an upper intermediate interlayer insulating layer 183 on the planarized lower interlayer insulating layer 181 with further reference to FIG. 1D.

Figure 7A:
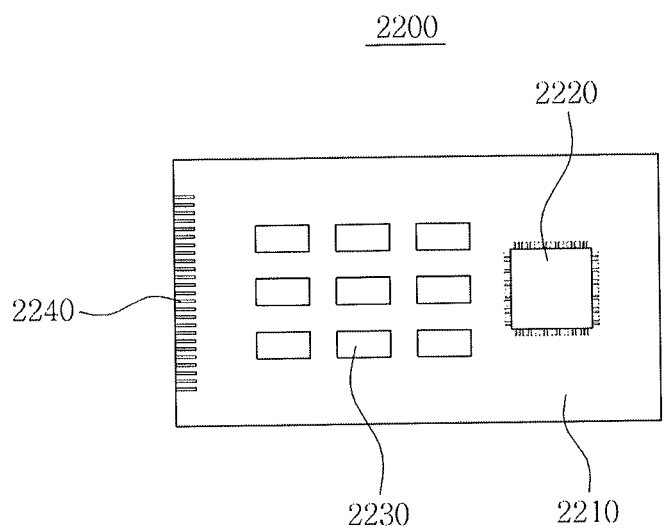
FIGS. 7A to 7D illustrate schematic views of a semiconductor module, electronic systems, and mobile devices including a semiconductor device according to the various embodiments.

FIG. 7A illustrates a conceptual view of a semiconductor module 2200 including at least one of semiconductor devices 10A to 10D according to various embodiments. Referring to FIG. 7A, the semiconductor module 2200 according to an embodiment may include one of the semiconductor devices 10A to 10D according to various embodiments mounted on the semiconductor module substrate 2210. The semiconductor module 2200 may further include a microprocessor 2220 mounted on the module substrate 2210. Input/output terminals 2240 may be disposed around at least one lateral surface of the module substrate 2210. The semiconductor module 2200 may include a memory card or a solid state disk (SSD).

Figure 7B:
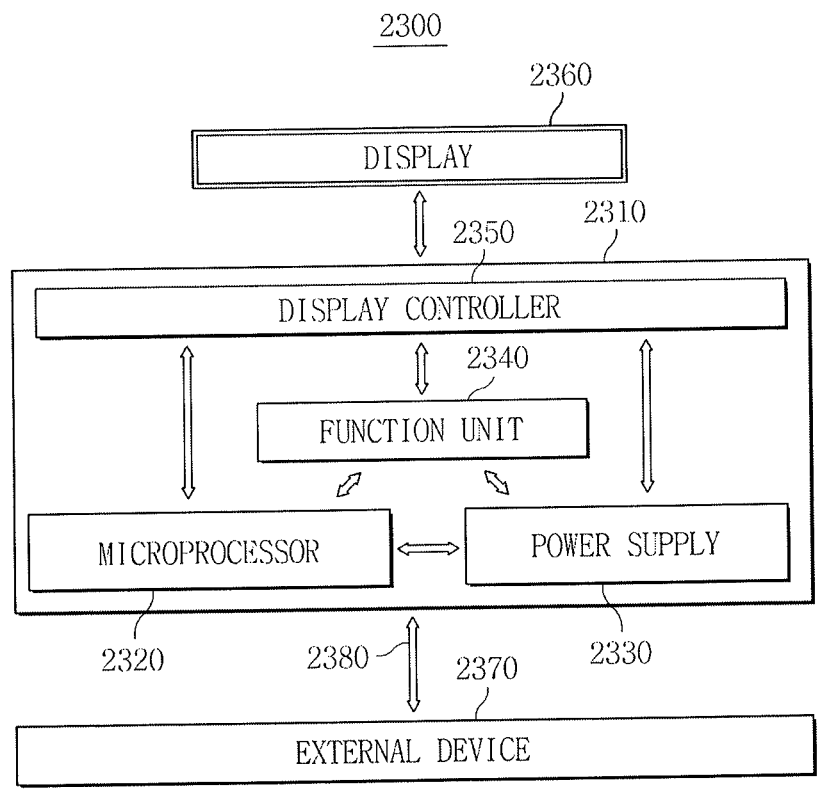

FIG. 7B illustrates a conceptual block diagram of an electronic system 2300 including at least one of the semiconductor devices 10A to 10D according to various embodiments. Referring to FIG. 7B, the semiconductor devices 10A to 10D may be applied to the electronic system 2300 according to various embodiments. The electronic system 2300 may include a body 2310. The body 2310 may include a micro processor unit 2320, a power unit 2330, a function unit 2340, and a display controller unit 2350. The body 2310 may be a system board or main board formed of a PCB or the like. The micro processor unit 2320, the power supply unit 2330, the function unit 2340 and the display controller unit 2350 may be mounted or installed on the body 2310. A display unit 2360 may be mounted in or on the body 2310. For example, the display unit 2360 may be disposed on a surface of the body 2310 to display an image processed by the display controller unit 2350. The power supply unit 2330 may be supplied with a predetermined voltage from an external power supply, and may divide the voltage into a required voltage level to supply to the micro processor unit 2320, the function unit 2340 and the display controller unit 2350. The micro processor unit 2320 may be supplied with a voltage from the power supply unit 2330 to control the function unit 2340 and the display unit 2360. The function unit 2340 may perform various functions of the electronic system 2300. For example, when the electronic device 2300 is a cellular phone, the function unit 2340 may include various components capable of functioning as a cellular phone such as dialing, outputting an image on the display unit 2360 as a result of communication with an external device 2370, and outputting voice through a speaker. Furthermore, when the external device 2370 includes a camera, the function unit 2340 may function as a camera image processor. In other embodiments, when the electronic system 2300 is connected to a memory card for capacity expansion, the function unit 2340 may be a memory card controller. The function unit 2340 may transmit or receive a signal to or from the external device 2370 via a wired or wireless communication unit 2380. Moreover, when the electronic system 2300 requires a universal serial bus (USB) for function expansion, the functional unit 2340 may function as an interface controller. The semiconductor devices 10A to 10D according to various embodiments may be included in at least one of the micro processor 2320 and the function unit 2340.

Figure 7C:
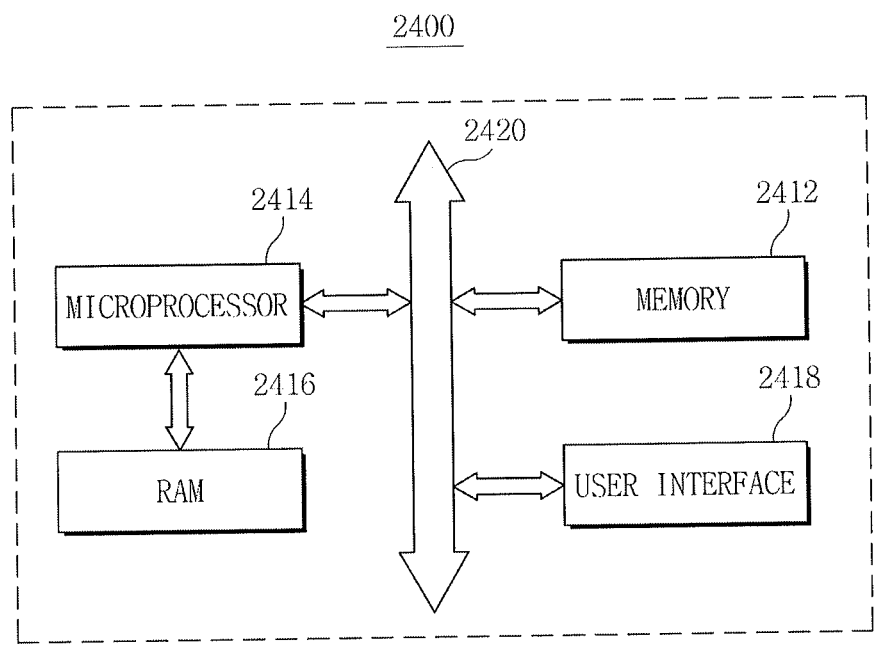

FIG. 7C illustrates a schematic block diagram of an electronic system 2400 having at least one of semiconductor devices 10A to 10D according to various embodiments. Referring to FIG. 7C, an electronic system 2400 may include at least one of semiconductor devices 10A to 10D according to various embodiments. The electronic system 2400 may be used in the fabrication of a mobile device or computer. For example, the electronic system 2400 may include a user interface 2418 performing data communication using a memory system 2412, a microprocessor 2414, a memory (for example, RAM 2416) and a bus 2420. The microprocessor 2414 may program or control the electronic system 2400. The RAM 2416 may be used as an operation memory of the microprocessor 2414. For example, the microprocessor 2414 or RAM 2416 may include at least one of semiconductor devices 10A to 10D according to embodiments. The microprocessor 2414, the RAM 2416 and/or the other components may be assembled in a single package. The user interface 2418 may be used in inputting data into the electronic system 2400 or outputting data from the electronic system 2400. A memory system 2412 may store codes for operating the microprocessor 2414, data processed by the microprocessor 2414 or externally input data. The microprocessor 2414 may include a controller and a memory.

Figure 7D:
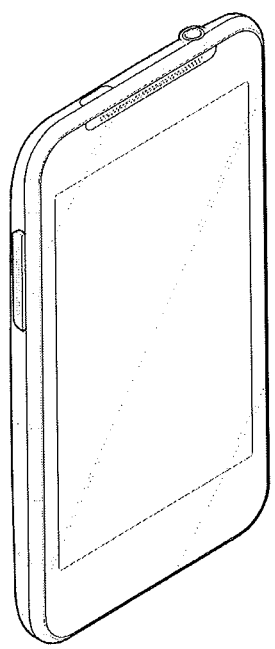

FIG. 7D illustrates a schematic view of a mobile phone 2500 including at least one of semiconductor devices 10A to 10D according to various embodiments. The mobile phone 2500 may be a mobile phone or a tablet PC. In addition, at least one of the semiconductor devices 10A to 10D according to various embodiments may be used for a portable computer such as a notebook in addition to a mobile phone or tablet PC, a mpeg-1 audio layer 3 (MP3) player, a MP4 player, a navigation device, a solid state disk (SSD), a desktop computer, an automobile or an electric appliance.

Semiconductor devices according to embodiments may include resistive patterns of a uniform size. The semiconductor devices according to embodiments may have resistive patterns that exhibit a reduced difference between a designed size and a formed size. Methods of fabricating semiconductor devices according to embodiments may include forming sacrificial patterns adjusting a pattern density such that sizes of resistive patterns are uniform. According to the methods of fabricating the semiconductor devices according to embodiments, the sacrificial patterns may reduce loading effects such that the resistive patterns may be uniformly patterned.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device, the method comprising:
    etching a substrate to form a field trench defining an active region and a lower gate pattern on the active region, the lower gate pattern including a tunneling insulating pattern and a lower gate electrode pattern;
    filling a field insulating material in the field trench to form a field region;
    forming an upper gate pattern on the lower gate pattern;
    sequentially forming a stopping layer and a buffer layer on the field region and the upper gate pattern;
    forming a first resistive pattern on the buffer layer of the field region, and forming a second resistive pattern on the buffer layer on the upper gate pattern;
    forming an interlayer insulating layer covering the first and second resistive patterns; and
    performing a planarization process to remove a top surface of the interlayer insulating layer and to remove the second resistive pattern.

2. The method as claimed in claim 1, wherein the upper gate pattern includes a barrier pattern, a metal pattern, and a gate capping pattern, which are sequentially stacked.

3. The method as claimed in claim 2, wherein the gate capping pattern includes:
    a lower gate capping pattern including silicon nitride, and
    an upper gate capping pattern including silicon oxide.

4. The method as claimed in claim 2, further comprising forming an intermediate gate pattern between the lower gate pattern and the upper gate pattern, wherein the intermediate gate pattern has a greater horizontal width than that of the lower gate pattern, and has a lateral surface aligned with the upper gate pattern.

5. The method as claimed in claim 4, wherein:
    the intermediate gate pattern includes an inter-gate insulating pattern formed on the lower gate pattern and an intermediate gate electrode pattern that is formed on the inter-gate insulating pattern, wherein the intermediate gate electrode pattern penetrates the inter-gate insulating pattern and is in contact with the lower gate electrode, and
    the intermediate gate electrode pattern includes polysilicon having p-type impurities.

6. The method as claimed in claim 5, wherein the intermediate gate electrode pattern includes:
    a first intermediate gate electrode pattern vertically overlapping the inter-gate insulating pattern, and
    a second intermediate gate electrode pattern that is formed on the first intermediate gate electrode pattern, wherein the second intermediate gate electrode pattern penetrates the first intermediate gate electrode pattern and the inter-gate insulating pattern and is in contact with the lower gate electrode.

7. The method as claimed in claim 4, wherein:
    the intermediate gate pattern partially extends to and horizontally overlaps a portion of the lateral surface of the lower gate pattern, and
    the field insulating material is interposed between a portion of the intermediate gate pattern and a portion of the lower gate pattern, which horizontally overlap.

8. The method as claimed in claim 1, wherein:
    the buffer layer includes silicon oxide, and
    the stopping layer includes silicon nitride.

9. The method as claimed in claim 1, wherein the performing of the planarization process includes removing the buffer layer formed on the upper gate pattern to expose the stopping layer on the upper gate pattern.

10. The method as claimed in claim 9, wherein the performing of the planarization process further includes removing the exposed stopping layer to expose the top surface of the upper gate pattern.

11. The method as claimed in claim 1, further comprising forming a gate spacer on a lateral surface of the upper gate pattern before forming the stopping layer, wherein the stopping layer is formed on an external lateral surface of the gate spacer.

12. The method as claimed in claim 1, wherein the forming of the field region includes:

filling the field trench and forming the field insulating material covering the lower gate pattern;

performing a planarization process to planarize top surfaces of the field insulating material and the lower gate pattern; and recessing the top surface of the field insulating material such that the top surface of the field insulating material is aligned with a lateral surface of the lower gate electrode pattern.

13. The method as claimed in claim 1, wherein:

the lower gate electrode pattern includes polysilicon having a p-type impurity, and the first resistive pattern and the second resistive pattern include polysilicon having an n-type impurity.

14. The method as claimed in claim 1, further comprising conformally forming a gate liner including silicon oxide on a top surface and a lateral surface of the upper gate pattern before forming the stopping layer.

15. A method of fabricating a semiconductor device, the method comprising:

forming a tunneling insulating layer and a lower gate electrode layer on a substrate;

etching the lower gate electrode layer, the tunneling insulating layer and the substrate to form a field trench defining structures including active regions and lower gate patterns on the active regions, the field trench being disposed between the structures including active regions and the lower gate patterns;

filling a field insulating material in the field trench to form a field region;

forming upper gate patterns on the lower gate patterns;

forming gate spacers on lateral surfaces of the upper gate patterns, the gate spacers being in contact with the field insulating material;

forming a stopping layer, a buffer layer and a resistive layer covering top surfaces of the upper gate patterns and the gate spacers, the stopping layer, the buffer layer and the resistive layer extending onto the field region;

forming first resistive patterns on the field region, and forming second resistive patterns on the upper gate patterns by patterning the resistive layer;

forming an interlayer insulating layer covering the first and second resistive patterns; and performing a planarization process to remove a top surface of the interlayer insulating layer, and to remove the second resistive pattern and a portion of the buffer layer on the upper gate patterns.

16. A method of fabricating a semiconductor device, the method comprising:

forming dummy elements on a substrate; and forming resistive patterns between the dummy elements, the dummy elements being gate patterns formed on active regions and including p-type polysilicon and the resistive patterns being formed on a field region between the active regions and including n-type polysilicon.

17. The method as claimed in claim 16, wherein the active regions and the field region are formed by:

forming a tunneling insulating layer and a lower gate electrode layer on the substrate, etching the lower gate electrode layer, the tunneling insulating layer, and the substrate to form a field trench defining the active regions, the active regions having the lower gate patterns thereon, and the field trench being between the active regions, and filling the field trench with a field insulating material to form the field region.

18. The method as claimed in claim 17, wherein forming the dummy elements and the resistive patterns further includes:

forming intermediate gate patterns and upper gate patterns on the lower gate patterns, forming gate spacers on lateral surfaces of the intermediate gate patterns and the upper gate patterns, forming a stopping layer, a buffer layer and a resistive layer covering top surfaces of the upper gate patterns and the gate spacers, the stopping layer, the buffer layer and the resistive layer extending into the field region to cover the field insulating material, and patterning the resistive layer to form the resistive patterns on the field region and sacrificial resistive patterns on the upper gate patterns, forming an interlayer insulating layer covering the resistive patterns on the field region and the sacrificial resistive patterns on the upper gate patterns; and performing a planarization process to remove a top surface of the interlayer insulating layer, and to remove the sacrificial resistive patterns and the buffer layer from the upper gate patterns.

19. The method as claimed in claim 18, wherein the planarization process further removes the stopping layer from the upper gate patterns.

20. The method as claimed in claim 18, further including conformally forming a gate liner including silicon oxide on a top surface and lateral surface of the upper gate pattern before forming the stopping layer.

* * * * *